United States Patent [19]
Mycynek

[11] Patent Number: 5,444,422
[45] Date of Patent: Aug. 22, 1995

[54] LOW PHASE NOISE HIGH FREQUENCY INTEGRATED OSCILLATOR WITH MINIMUM PINS

[75] Inventor: Victor G. Mycynek, Des Plaines, Ill.

[73] Assignee: Zenith Electronics Corp., Glenview, Ill.

[21] Appl. No.: 309,991

[22] Filed: Sep. 20, 1994

[51] Int. Cl.⁶ .......................... H03B 5/12; H03B 5/36
[52] U.S. Cl. ........................ 331/116 R; 331/117 R;
                                    331/177 V; 331/115
[58] Field of Search ............ 331/115, 116 R, 116 FE,
                                 331/117 R, 117 FE, 177 V

[56] References Cited

U.S. PATENT DOCUMENTS

| | | | |
|---|---|---|---|
| 4,518,930 | 5/1985 | Rozema et l. | 331/116 R |
| 4,745,375 | 5/1988 | Suzuki | 331/116 R |
| 5,341,112 | 8/1994 | Haman | 331/116 R |

FOREIGN PATENT DOCUMENTS 2141299  12/1984  United Kingdom ............ 331/116 R Primary Examiner—Siegfried H. Grimm

[57] ABSTRACT

A low phase noise, high frequency low voltage integrated circuit oscillator has a minimum number of live pins. It includes a three transistor current mirror defining a voltage node and a current node with an emitter follower transistor coupled between the voltage node and the current node. An output is taken from the emitter follower transistor and a tuned circuit is coupled to the voltage node. A pair of power supply pins are provided for power application to the integrated circuit and one live pin is coupled to the voltage node. A tuning circuit for affecting capacitance changes for varying the frequency of the oscillator is connectable to the voltage node. In some versions of the oscillator that use a separate crystal, additional pins are needed.

7 Claims, 5 Drawing Sheets

5,444,422

LOW PHASE NOISE HIGH FREQUENCY INTEGRATED OSCILLATOR WITH MINIMUM PINS

BACKGROUND OF THE INVENTION AND PRIOR ART

This invention relates in general to oscillators and particularly to a high frequency oscillator that exhibits extremely low phase noise, will operate with low power supply potential and lends itself to integrated circuit implementation. In the preferred embodiment of the invention, a low phase noise, integrated circuit oscillator that free runs above 200 MHz with approximately 1.2 volts applied potential, results. In addition to the power supply connection pins (B+ and ground) for the integrated circuit, only a single "live" or signal connection pin is required. The minimization of the number of live pins, i.e. pins at which there are voltage changes, results in a highly stable oscillator exhibiting a low phase noise characteristic. Further, the oscillator of the invention operates with extremely low DC power voltages, which is compatible with the trend in integrated circuits toward low voltage, high frequency operation. Basically the oscillator requires a two diode voltage drop for operation, that is approximately 1.2 volts.

The inventive oscillator uses a current mirror that consists of three NPN transistors, with a fourth transistor being added for voltage balancing purposes. As is known, the three transistor current mirror is much less dependent upon Beta than the conventional two transistor mirror. It has been found that, by appropriate interconnection of a feedback path to a current node on the three transistor current mirror, a negative resistance region is formed. The steepness of the negative resistance region may be controlled by the amount of resistance in the feedback path which forms the basis for the oscillator. A conventional varactor diode tuning control is connectable to the single pin (as is the tuned circuit) for establishing the oscillator's fundamental frequency. The invention provides a very stable, high frequency, low operating voltage, readily integratable oscillator that exhibits very low phase noise.

OBJECTS OF THE INVENTION

A principal object of the invention is to provide an improved oscillator.

Another object of the invention is to provide a low phase noise, high frequency oscillator suitable for integrated circuit applications.

A further object of the invention is to provide an integrated circuit, low phase noise, high frequency oscillator that uses a minimum number of live pins.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
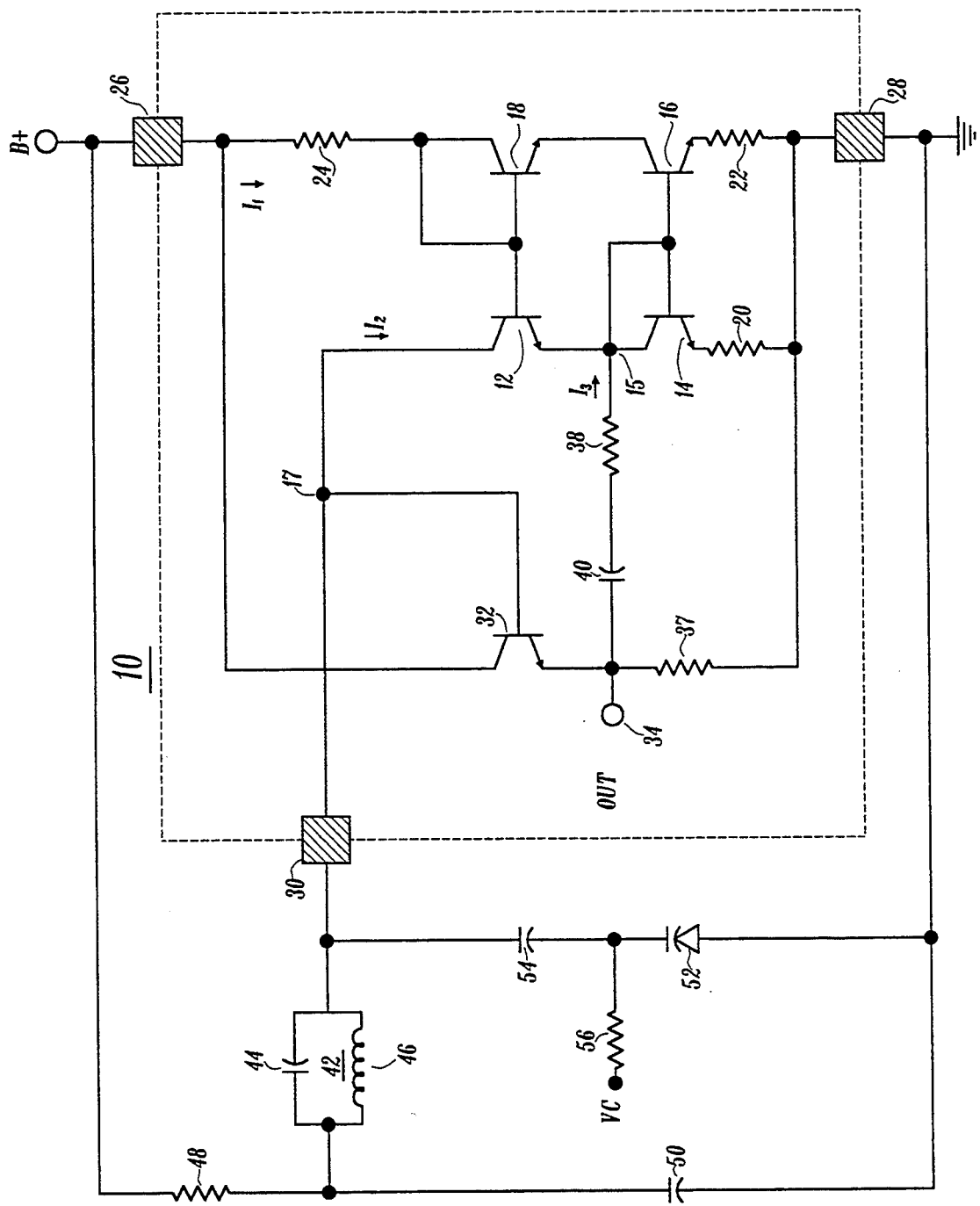
FIG. 1 is a schematic diagram illustrating the oscillator of the invention.

FIG. 1 illustrates an integrated circuit 10 (indicated by the elements within dashed lines) which incorporates a three transistor current mirror comprising NPN transistors 12, 14 and 16 connected as illustrated. As mentioned, another NPN transistor 18, although not part of the current mirror, is incorporated to balance the voltage drops around the current mirror. The emitters of transistors 14 and 16 are connected through resistors 20 and 22, respectively, to a ground supply pin terminal 28 and the collector of transistor 18 is connected through a resistor 24 to a B+ supply pin terminal 26. A current node 15 is established at the junction of the emitter of transistor 12 and the collector of transistor 14 and a voltage node 17 is established at the collector of transistor 12. An emitter follower transistor 32 is connected from voltage node 17 to an output terminal 34 by a feedback circuit that comprises a resistor 38 and a capacitor 40. Resistor 38 and capacitor 40 are serially connected between output terminal 34 and current node 15. A resistor 37 connects output terminal 34 to ground supply pin terminal 28 and the collector of emitter follower transistor 32 is connected to B+ supply pin terminal 26. The single live pin 30 of the IC 10 is coupled to voltage node 17 and represents the "one pin" of the oscillator. Connected to pin 30 is a tuned circuit 42 comprising a capacitor 44 connected in parallel with a coil 46. This parallel combination of elements is in turn coupled via a resistor 48 to B+ and via a capacitor 50 to ground. Capacitor 50 has a magnitude such that the junction of capacitor 50 and resistor 48 is very stable, i.e. at AC ground potential. A tuning control circuit is provided by means of a varactor diode 52 that is coupled in series with a capacitor 54 and connected to pin 30. A source of DC control voltage VC is connected through a resistor 56 to the junction of varactor diode 52 and capacitor 54.

The basic current flow in the current mirror is illustrated by the arrowed currents $I_1$, $I_2$ and $I_3$ and the fundamental equation is that $I_2 = I_1 - I_3$. Another fundamental relationship is that the voltage developed at output terminal 34 follows the voltage at voltage node 17. Resistor 38 determines the steepness of the negative resistance region and the resonance of tuned circuit 42 determines the frequency of oscillation of the oscillator. Capacitor 40 provides AC coupling of the fed back signal $I_3$. The amount of coupling is very small and precludes upsetting the DC bias of the three transistor current mirror.

In operation, voltage node 17 will be moving slightly (either positive or negative) due to the small signals inherent in the integrated circuit 10. If it is moving positive, the output terminal 34 will also move in a positive direction and a small current $I_3$ will be generated. The $I_3$ current results in a decrease in the current $I_2$ and voltage node 17 will become increasingly positive. The gain that is driving voltage node 17 in the positive direction is related to the impedance of the LC circuit at resonance divided by the resistance of resistor 38. The voltage on voltage node 17 (and on the output terminal 34) and the current $I_3$ will continue to increase until the negative resistance of voltage terminal 17 increases to the point where the positive loop gain falls below unity. The negative resistance increases as the emitter of transistor 12 rises with respect to its base. At that point, the energy stored in tuned circuit 42 causes the voltage on voltage node 17 to decrease, which in turn decreases the voltage at output terminal 34 and the current $I_3$. A decrease in $I_3$ results in an increase in $I_2$ and a further decrease in the voltage of voltage node 17. This repeated action continues to occur at the resonant frequency of tuned circuit 42 where the resistance of the LC circuit is high.

The negative feedback to transistors 12, 14 and 16 in the current mirror reduces the effective impedance of current node 15. The current limiting action of the emitter of transistor 12 establishes the peak to peak operating current for the oscillator. On the positive going cycle, the emitter of transistor 12 is moved toward cut off. Since it is limiting that occurs in the emitter of transistor 12 (and not saturation) and since the small peak to peak voltage is present at current node 15, the effects of parasitics are minimal and the oscillator exhibits very low phase noise. This is in contrast with oscillators that limit by the saturation of base emitter junctions. The only node that changes voltage is voltage node 17 (and output terminal 34). The current node 15 is a virtual AC ground and is insensitive to parasitic capacitances. The collector of transistor 18 is also a virtual AC ground and exhibits a low input impedance whereas the voltage node 17 exhibits a very high output impedance. Buffering of voltage node 17 and output terminal 34 by the emitter follower transistor 32 and the connection of the output terminal 34 to current node 15 through resistor 38 establishes a positive feedback around the three transistor current mirror. This of course provides for the negative resistance region of the configuration.

Figure 2:
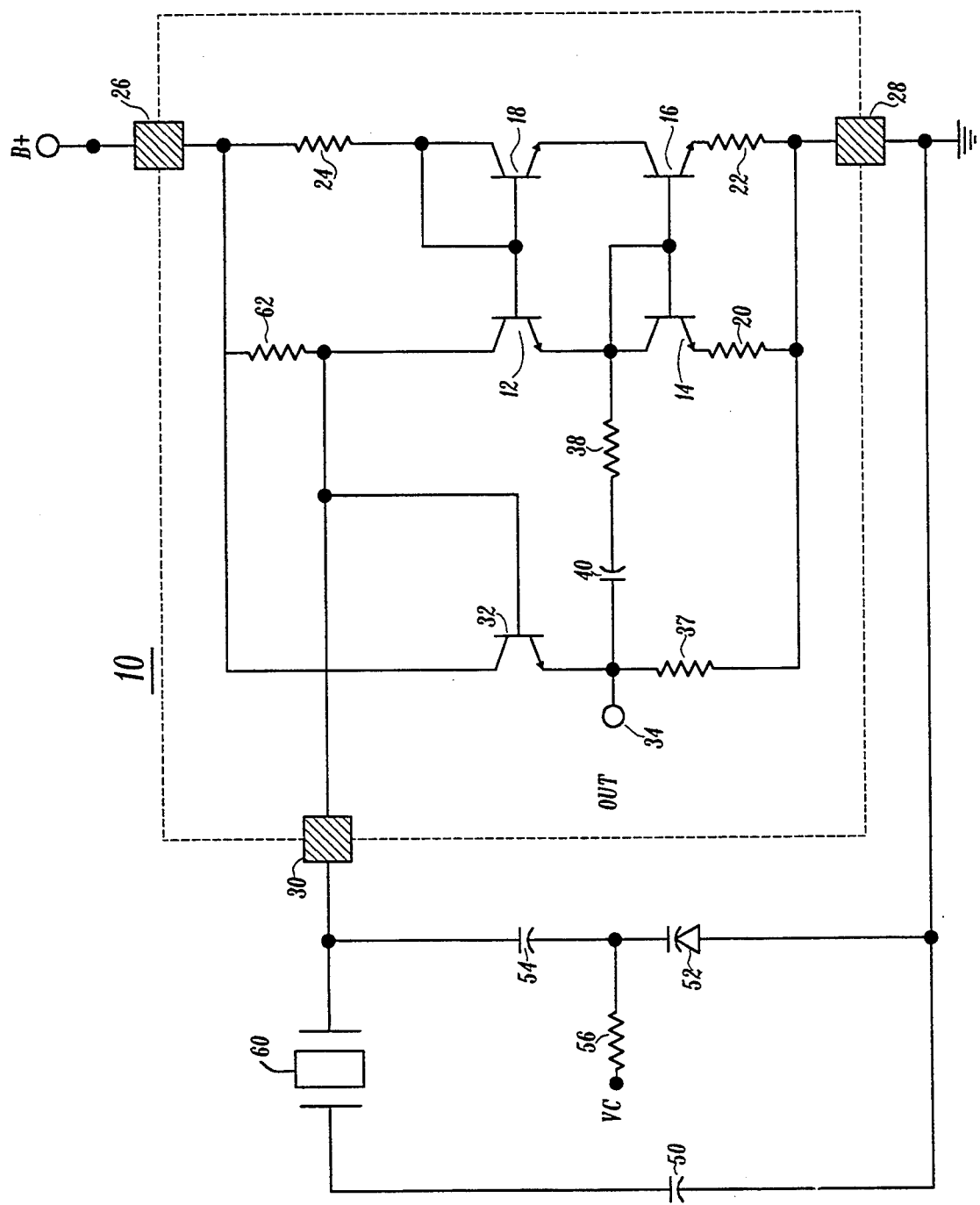
FIG. 2 illustrates a modification of the oscillator of FIG. 1 utilizing a crystal.

In the circuit of FIG. 2, a crystal 60 replaces the tuned circuit 42. B+ is provided to the collector of transistor 12 through a resistor 62 in this version. In other respects, the circuit operates the same way.

Figure 3:
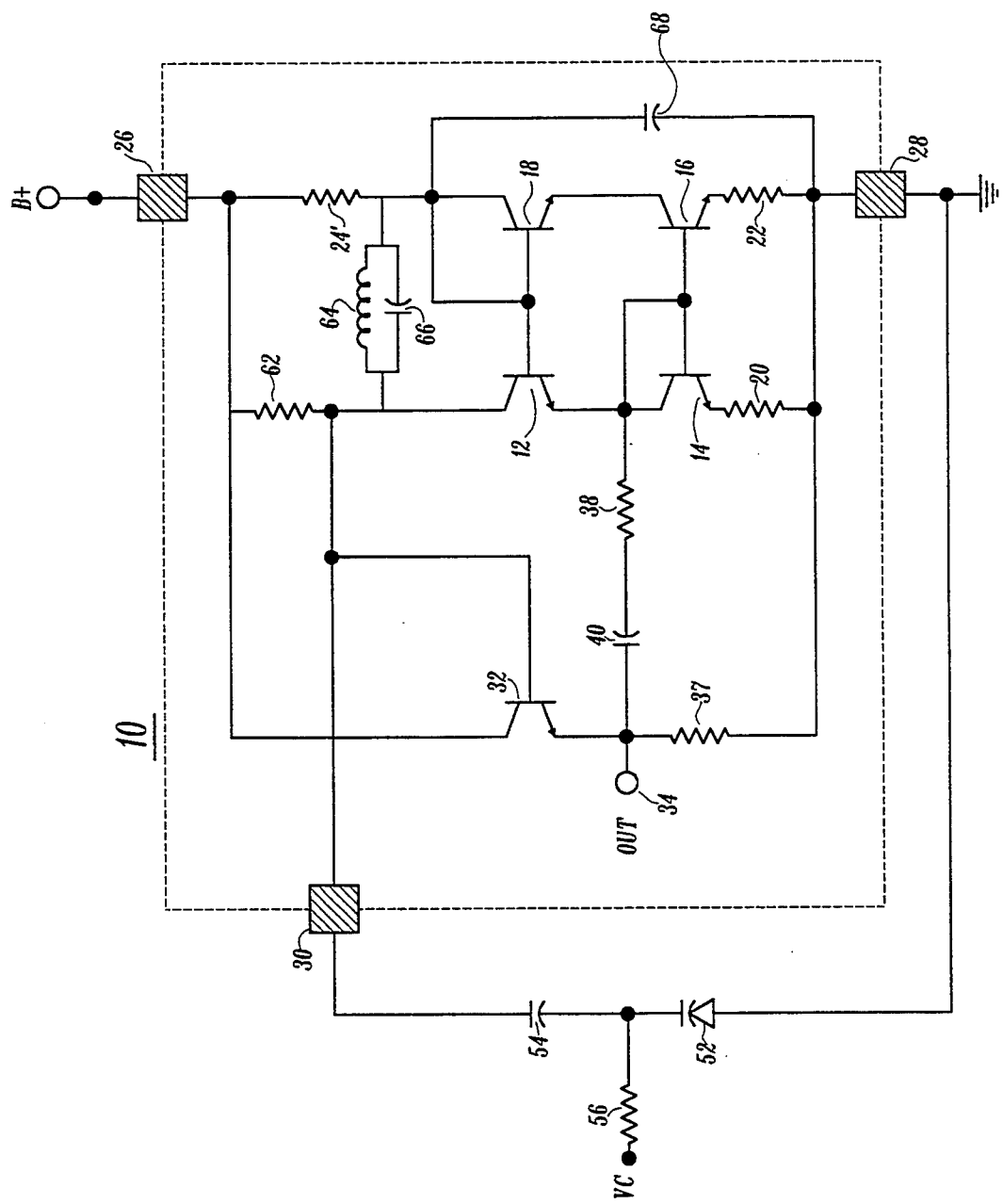
FIG. 3 illustrates another modification of the FIG. 1 oscillator where the parallel tuned circuit is included within the integrated circuit.

In FIG. 3, the crystal 60 and the bypass capacitor 50 have been removed from the FIG. 2 implementation. An LC circuit, consisting of a parallel connected coil 64 and capacitor 66, is connected between the collectors of transistors 12 and 18 with the collector of transistor 18 being bypassed by a capacitor 68. In this arrangement, the collector resistor 24 of transistor 18 is changed in value and is referred to as resistor 24'. Whereas in the previous FIGS. 1 and 2, the load resistor 24 is on the order of 3,000 ohms and load resistor 62 (and resistor 48) on the order of 1,800 ohms, in this version resistor 62 and resistor 24' are each 1,800 ohms. The FIG. 3 circuit is not preferred since transistor 12 has a tendency to saturate. Nonetheless, the circuit may be useful in very low B+ application since there is no need for more than 1½ volts, and it includes many of the other benefits of the previously described circuits.

Figure 4:
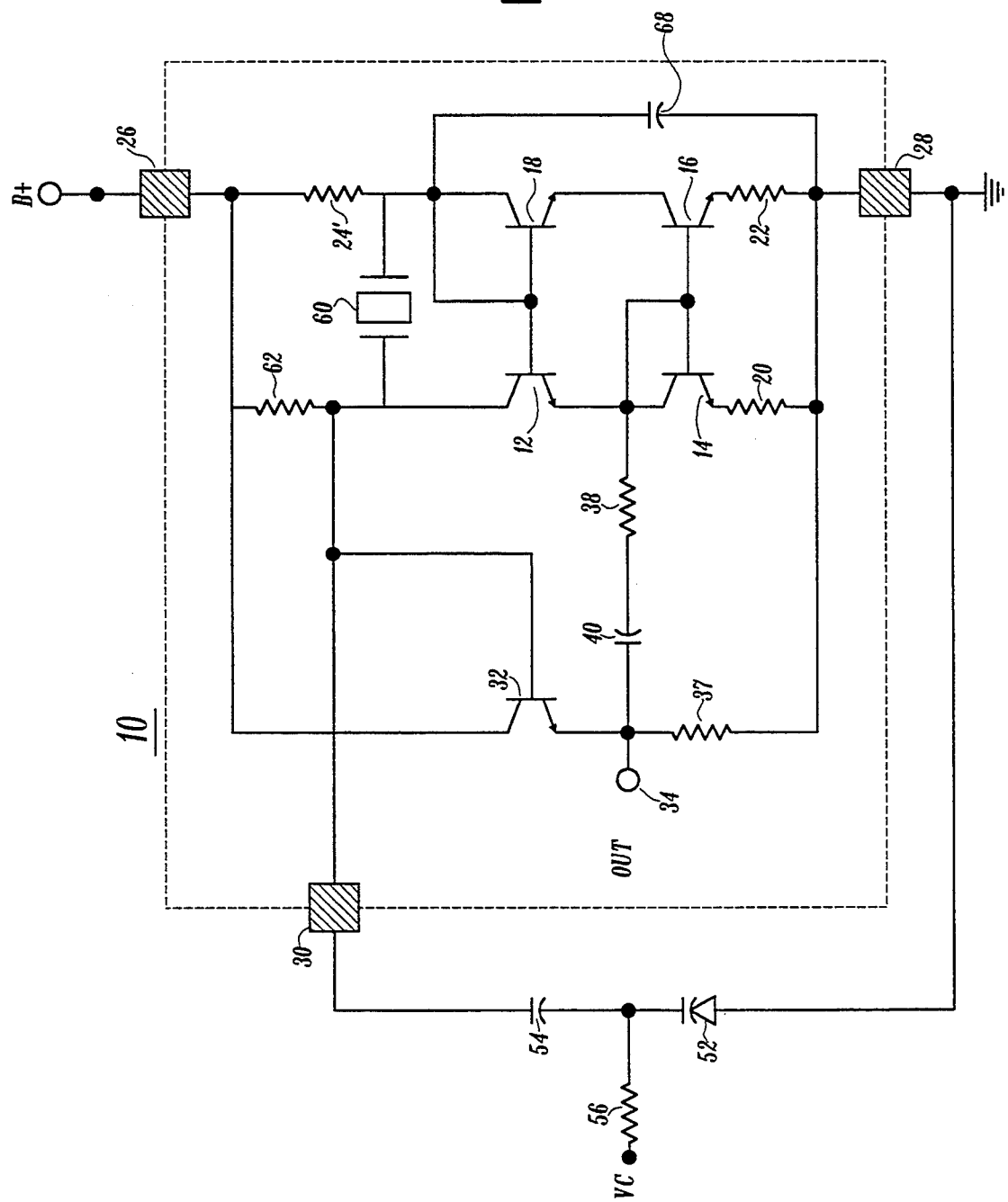
FIG. 4 is a modification of the oscillator of FIG. 3 substituting a crystal for the parallel tuned circuit.

The circuit of FIG. 4 is very similar to the FIG. 3 implementation in that the LC circuit has been replaced with the crystal 60. In other respects, the circuit is the same as the previously described circuit in FIG. 3. Because of the location of the crystal 60, it is of course necessary to add two connection pins so the one pin oscillator becomes a three pin oscillator.

Figure 5:
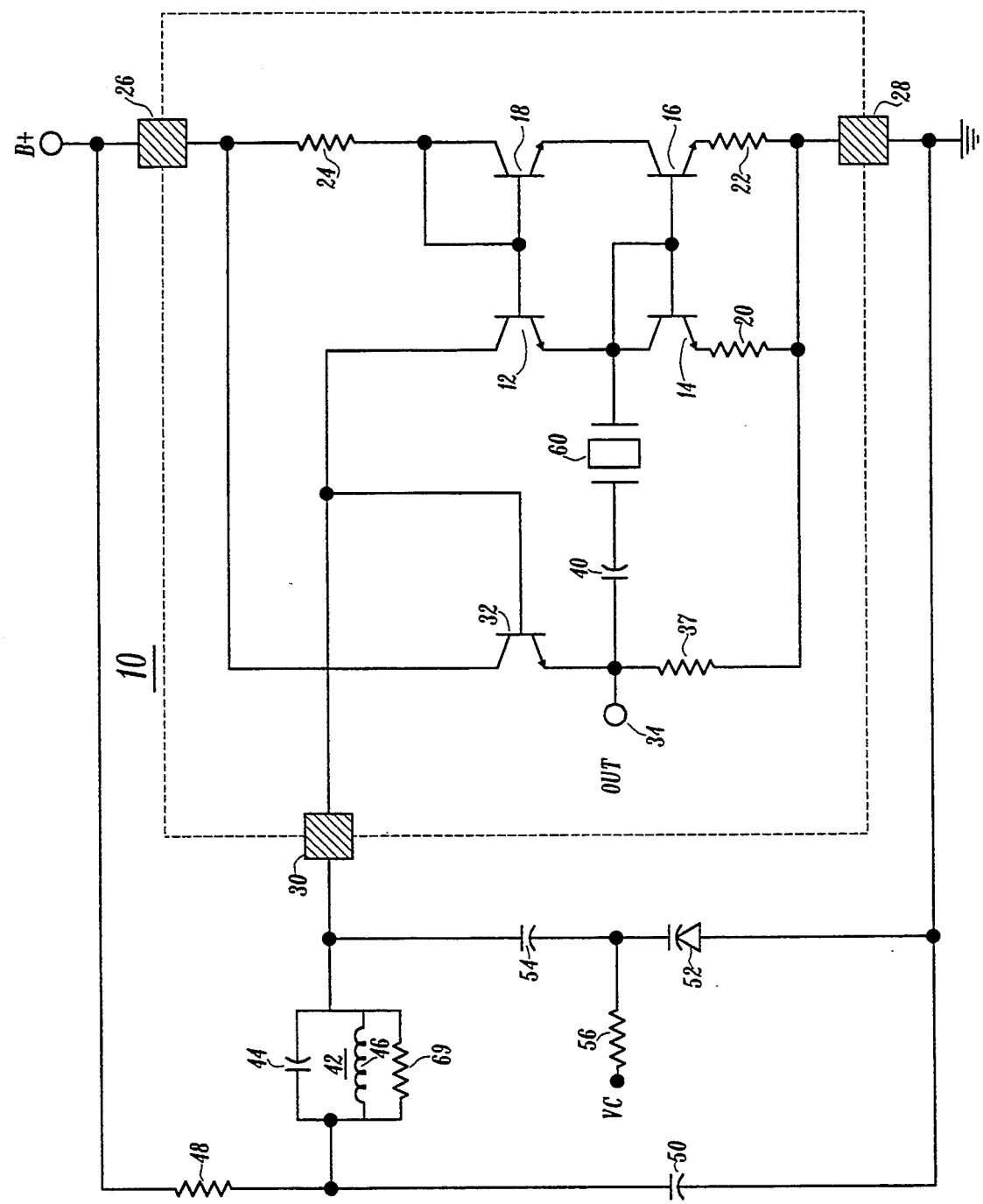
FIG. 5 illustrates a further modification of the FIG. 1 oscillator with a crystal in the feedback circuit, and the tuned parallel circuit modified to enable operation at a harmonic of the crystal resonant frequency.

Finally, in FIG. 5, a variation of FIG. 1 is shown in which a resistor 69 is added across the tuned circuit 42 for broadening the response curve of the tuned circuit. Also resistor 38 in the feedback path has been replaced with the crystal 60, thus making the configuration a three pin oscillator. In this configuration, the tuned circuit 42 broadly selects the range of operation for the crystal 60 and the crystal 60 is a series tuned element. Capacitor 40 is retained for AC coupling of the crystal 60. This configuration is used where the crystal 60 is to operate at an odd multiple of its fundamental frequency and preselection of the frequency is required to prevent the crystal from operating at its fundamental frequency. The arrangement of the tuned circuit 42, with the parallel connection of resistor 69 of approximately 10,000 ohms to lower the Q of the bandpass, tunes to the preselected frequency. In effect there is combined series and parallel tuning with this configuration. While using three pins (in addition to the power supply pins), the benefits of the one pin oscillator, such as low phase noise and operating voltage, are retained.

It is recognized that numerous changes in the described embodiment of the invention will be apparent to those skilled in the art without departing from its true spirit and scope. The invention is to be limited only as defined in the claims.

What is claimed is:

1. An oscillator comprising:
   a current mirror having a voltage node and a current node;
   an output terminal;
   low impedance means coupling said output terminal with said voltage node;
   a feedback circuit coupling said output terminal to said current node; and
   a tuned circuit coupled to said voltage node.

2. The oscillator of claim 1, further including variable capacitance tuning means coupled to said voltage node for changing the frequency of oscillation of said oscillator.

3. The oscillator of claim 1 wherein said current mirror comprises three transistors and wherein said low impedance means and said feedback circuit are part of an integrated circuit, further including:
   power supply terminals forming connection pins of said integrated circuit; and
   said voltage node forming another connection pin of said integrated circuit.

4. The oscillator of claim 3 wherein said feedback circuit includes a capacitor tuned circuit and said tuned circuit comprises a parallel tuned LC circuit.

5. The oscillator of claim 1 wherein said low impedance means comprises:
   an emitter follower transistor having a base electrode coupled to said voltage node and an emitter electrode coupled to said output terminal.

6. The oscillator of claim 2 wherein said variable capacitance tuning means comprises a varactor diode and a tuning voltage for changing the capacitance exhibited by said varactor diode.

7. An integrated circuit oscillator having a minimum number of connection pins comprising:
   a three transistor current mirror defining a voltage node, connected to a signal pin of said oscillator, and a current node;
   a feedback circuit coupled between said current node and an output terminal;
   an emitter follower transistor connected between said output terminal and said voltage node; and
   a tuned circuit coupled to said voltage node for controlling the frequency of said oscillator.

* * * * *